(12) United States Patent
Parkhe et al.

(10) Patent No.: US 7,824,498 B2
(45) Date of Patent: Nov. 2, 2010

(54) COATING FOR REDUCING CONTAMINATION OF SUBSTRATES DURING PROCESSING

(75) Inventors: Vijay D. Parkhe, San Jose, CA (US); Kurt J. Ahmann, San Jose, CA (US); Matthew C. Tsai, Cupertino, CA (US); Steve Sansoni, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 414 days.

(21) Appl. No.: 10/786,876

(22) Filed: Feb. 24, 2004

(65) Prior Publication Data
US 2005/0183669 A1 Aug. 25, 2005

(51) Int. Cl.
*C23C 16/00* (2006.01)
*H01L 21/306* (2006.01)
*H01L 21/683* (2006.01)
*C23F 1/00* (2006.01)
*B23B 31/38* (2006.01)

(52) U.S. Cl. .............. 118/728; 118/724; 118/725; 156/345.51; 156/345.52; 156/345.53; 279/128; 361/234

(58) Field of Classification Search .......... 156/345.51–345.53; 118/724, 725, 728; 279/128; 361/234
See application file for complete search history.

(56) References Cited
U.S. PATENT DOCUMENTS

| | | | |
|---|---|---|---|
| 3,789,248 A | 1/1974 | Jaecklin et al. | |
| 4,987,004 A | 1/1991 | Yamazaki et al. | |
| 5,032,243 A | 7/1991 | Bache et al. | |
| 5,041,201 A | 8/1991 | Yamazaki et al. | |
| 5,352,493 A * | 10/1994 | Dorfman et al. | ............ 427/530 |
| 5,458,754 A | 10/1995 | Sathrum et al. | |
| 5,495,979 A | 3/1996 | Sastri et al. | |
| 5,583,736 A * | 12/1996 | Anderson et al. | ........... 361/234 |
| 5,638,251 A | 6/1997 | Goel et al. | |
| 5,669,644 A | 9/1997 | Kaihotsu et al. | |
| 5,705,262 A | 1/1998 | Bou et al. | |

(Continued)

FOREIGN PATENT DOCUMENTS

CN 1178257 A 4/1998

(Continued)

OTHER PUBLICATIONS

"Custom Coating Solutions With Diamond-Like Coatings", Bekaert Advanced Coating Technologies, Amherst NY, from http://www.bactusa.com/pdfs/LWC125folderfinal.pdf on Jan. 16, 2004.

(Continued)

*Primary Examiner*—Karla Moore
(74) *Attorney, Agent, or Firm*—Ashok K. Janah (57) ABSTRACT

A substrate support has a support structure and a coating on the support structure having a carbon-hydrogen network. The coating has a contact surface having a coefficient of friction of less than about 0.3 and a hardness of at least about 8 GPa. The contact surface of the coating is capable of reducing abrasion and contamination of a substrate that contacts the contact surface. In one version, the support structure has a dielectric covering an electrode. A plurality of mesas on the dielectric have a coating with the contact surface thereon.

20 Claims, 5 Drawing Sheets

U.S. PATENT DOCUMENTS

| | | | |
|---|---|---|---|
| 5,718,926 A | | 2/1998 | Dambrine et al. |
| 5,728,465 A | * | 3/1998 | Dorfman et al. ............ 428/408 |
| 5,786,086 A | | 7/1998 | Frihart et al. |
| 5,812,362 A | | 9/1998 | Ravi |
| 5,903,428 A | | 5/1999 | Grimard et al. |
| 5,916,370 A | | 6/1999 | Chang |
| 5,935,323 A | * | 8/1999 | Tanga et al. .................... 117/79 |
| 5,952,060 A | * | 9/1999 | Ravi .......................... 427/577 |
| 5,969,934 A | * | 10/1999 | Larsen ....................... 361/234 |
| 5,977,519 A | | 11/1999 | Sorensen et al. |
| 6,001,756 A | | 12/1999 | Takahashi et al. |
| 6,020,036 A | | 2/2000 | Sugiyama et al. |
| 6,095,084 A | | 8/2000 | Shamouilian et al. |
| 6,187,704 B1 | | 2/2001 | Takahashi et al. |
| 6,191,390 B1 | | 2/2001 | Sorensen et al. |
| 6,200,675 B1 | | 3/2001 | Neerinck et al. |
| 6,214,755 B1 | | 4/2001 | Otsuki et al. |
| 6,217,969 B1 | | 4/2001 | Takahashi et al. |
| 6,228,471 B1 | | 5/2001 | Neerinck et al. |
| 6,261,370 B1 | | 7/2001 | Otsuki et al. |
| 6,386,963 B1 | | 5/2002 | Kenji et al. |
| 6,447,374 B1 | | 9/2002 | Sommer et al. |
| 6,472,062 B1 | | 10/2002 | Neerinck et al. |
| 6,508,911 B1 | | 1/2003 | Han et al. |
| 6,537,429 B2 | * | 3/2003 | O'Donnell et al. .......... 204/193 |
| 6,595,506 B1 | * | 7/2003 | Zide et al. ..................... 269/21 |
| 6,740,393 B1 | * | 5/2004 | Massler et al. .............. 428/408 |
| 6,759,800 B1 | | 7/2004 | Fernandez et al. |
| 6,853,043 B2 | | 2/2005 | Yeh et al. |
| 7,160,616 B2 | * | 1/2007 | Massler et al. .............. 428/408 |
| 7,367,872 B2 | | 5/2008 | Donohue |
| 7,407,893 B2 | | 8/2008 | Seamons et al. |
| 7,638,440 B2 | | 12/2009 | Wang et al. |
| 2003/0047283 A1 | | 3/2003 | Parkhe et al. |
| 2004/0055709 A1 | | 3/2004 | Boyd et al. |
| 2005/0183669 A1 | | 8/2005 | Parkhe et al. |
| 2005/0199585 A1 | | 9/2005 | Wang et al. |
| 2005/0252454 A1 | | 11/2005 | Parkhe et al. |

FOREIGN PATENT DOCUMENTS

| | | |
|---|---|---|
| EP | 322812 A2 * | 7/1989 |
| EP | 0 322 812 A2 | 11/1989 |
| EP | 0 806 798 A2 | 11/1997 |
| JP | 63-285892 | 11/1988 |
| JP | 63285892 | 11/1988 |
| JP | 10-217103 A | 8/1998 |
| JP | 10217103 A * | 8/1998 |
| TW | 293137 A | 12/1996 |
| TW | 0466667 | 12/2001 |
| WO | WO-9845090 | 10/1998 |
| WO | WO 02/01611 | 1/2002 |
| WO | WO-2004/001799 | 12/2003 |
| WO | WO-2004010484 | 1/2004 |
| WO | WO-2005087974 | 9/2005 |
| WO | WO-2005/083752 A3 | 1/2006 |

OTHER PUBLICATIONS

"Custom Coating Solutions With Diamond-Like Coatings," Bekaert Advanced Coating Technologies, Amherst, NY, from http://www.bactusa.com/pdfs/LWC125Brocker/pdf on Jan. 16, 2004.

News Release, "Bridgestone Develops Single Crystal Silicon Carbide Wafers for Semiconductor Devices", Bridgestone, Dec. 2, 2003, from http://www.bridgestone.co.jp/english/news/031203.html.

"PureBeta: Ultra High Purity Fine Ceramics (SiC) Component", Bridgestone Corporation, Tokyo, Japan, from http://www.purebeta.com on Jan. 16, 2004.

"PureBeta", Bridgestone Corporation, Tokyo, Japan, 2003 from http://www.purebeta.com/youto_e.html.

"Diamond-like carbon films", IUPAC Compendium of Chemical Technology, 2nd edition, 1997.

"Discussion of chip manufacturing," Bekaert Corporation, Amherst, NY, 2002 from http://www.bactusa.com/index.cfm?page=3a.

"E-Chucks," Surmet Corporation, 2003 from http://www.surmet.com/echucks.html.

"Coatings," Surmet Corporation, 2003 from http://www.surmet.com/coatings.html.

"Product Specification: TranSiMax(TM) Coating", Surmet Corporation, http://www.surmet.com/docs/product_sheet_silicon1020Nitride.pdf on Jan. 16, 2004.

"Product Specification- Surmet Black Beauty", Surmet Corporation, Burlington, MA, from http://www.surmet.com/docs/Product_Sheet_SBB.pdf on Jan. 16, 2004.

"Product Specification- UltraC Diamond (TM)", Surmet Corporation, Burlington, MA, from http://www.surmet.com/docs/Product%20Sheet_UltraC%20Diamond.pdf on Jan. 16, 2004.

"Product Specification-UltraC-HT(TM)", Surmet Corporation, Burlington, MA, from http://www.surmet.com/docs/Product_Sheet_UltraCHT.pdf on Jan. 16, 2004.

"Product Specification-Dust Free (TM) Ultra High Pure Silicon Coating (99.999%)", Surmet Corp, Burlington, MA, from http://www.surmet.com/docs/Product_Sheet_UltraCHT.pdf on Jan. 16, 2004.

"Product Specification-SilcoMax (TM) Coating", Surmet Corporation, Burlington, MA, from http://www.surmet.com/docs/Product_Sheet_S:C.pdf on Jan. 16, 2004.

"CVD-SiC Coating", Mitsue Engineering & Shipbuilding Co., Ltd., Japan, 2001 from http://www.mes.co.jp/english/product/mecha/c05.html.

Van Landingham, "Review of Instrumented Indentation", J. Res. Natl. Inst. Stand. Techno., Jul.-Aug. 2003, v.108, 249-265, Nat'l Inst. of Standards and Tech, Gaithersburg, MD.

ISR(Search Report), WIPO.

Diamonex Products, Diamond-Like Protective Coatings for Metals and Other Substrates, http://www.diamonex.com/products_dlc.htm (accessed Apr. 26, 2007).

Office Action dated Nov. 16, 2007 (Chinese Patent Office) in CN Patent App. No. 200580005773.8 entitled "Contaminant reducing substrate transport and support system", China.

Office Action dated Jul. 18, 2008 (Chinese Patent Office) in CN Patent App. No. 200580005773.8 entitled "Contaminant reducing substrate transport and support system", China.

Office Action dated Jan. 23, 2009 (Chinese Patent Office) in CN Patent App. No. 200580005773.8 entitled "Contaminant reducing substrate transport and support system", China.

Office Action dated Nov. 3, 2008 (TIPO) in Taiwan Patent App. No. 94105456 entitled "Contaminant reducing substrate transport and support system", Taiwan.

Office Action dated May 1, 2007 in U.S. Appl. No. 11/065,702 entitled "Contaminant reducing substrate transport and support system".

Final Office Action dated Oct. 31, 2007 in U.S. Appl. No. 11/065,702 entitled "Contaminant reducing substrate transport and supp . . . ".

Office Action dated Jun. 20, 2008 in U.S. Appl. No. 11/065,702 entitled "Contaminant reducing substrate transport and support system".

Final Office Action dated Dec. 24, 2008 in U.S. Appl. No. 11/065,702 entitled "Contaminant reducing substrate transport and support system".

"Introduction to Semiconductor Manufacturing Technology", Hong Xiao, New Jersey, 2001.

* cited by examiner

COATING FOR REDUCING CONTAMINATION OF SUBSTRATES DURING PROCESSING

BACKGROUND

Embodiments of the present invention relate to components used in the transportation and support of substrates in process chambers.

In the fabrication of semiconductors and displays, material is formed or deposited on a substrate, such as a semiconductor wafer or dielectric, by processes such as chemical vapor deposition (CVD), physical vapor deposition (PVD), ion implantation, oxidation and nitridation. The material formed on the substrate can also be etched to define features of electric circuits and devices. Such processes are generally performed in a process chamber in which a plasma may be generated. The substrate is transported from a cassette in a load-lock or transfer chamber to the process chamber on a robot blade. The transported substrate is placed on a set of lift pins that are lowered though holes in a substrate support to rest the substrate on the support. The substrate support often includes a pedestal, vacuum chuck having a vacuum port to suck down the substrate, or an electrostatic chuck comprising a dielectric covering an electrode to which a voltage is applied to generate an electrostatic force to hold the substrate. The chamber has enclosure walls about the substrate support, a gas distributor and exhaust, and a gas energizer.

During the transportation and support of the substrate, various support surfaces come in contact with the backside of the substrate, for example, the robot blade that contacts the substrate backside, the lift pin contact regions, and the receiving surface of the substrate support. Several other surfaces can also contact the substrate. For example, in some processes, the substrate is initially transported to a degassing heater plate on which it is rested to degas the substrate. The substrate may also be transferred to a cool-down pedestal to cool the substrate after rapid thermal processing or other high temperature processes. Shutter disks can also be provided to protect the surfaces of substrate supports when the substrate is not being held on the support.

The surfaces that contact the backside of the substrate can cause contaminants and residual matter to remain on the substrate. For example, stainless steel surfaces of a substrate support pedestal, cool down plate, or degas heater, can leave behind trace amounts of iron, chromium or copper on the back surfaces of the substrate. Nickel coated robotic blades could also leave residual nickel contaminant on the substrate when they are used to lift and transport the substrate. Similarly, aluminum pedestals can also leave behind small aluminum particles on the substrate. Shutter disks can contaminate the top surface of pedestal supports, with the contamination being transferred to the substrate when the substrate is placed on the pedestal support. While these contaminants are initially deposited on the inactive backside of the substrate, they diffuse into the active front side in subsequent high temperature annealing processes, causing shorts or failure of the circuits or displays of the substrate. The contaminants can also flake off from the substrate fall upon and contaminate other substrates. These contaminants eventually cause shorts in the electrical circuits of the substrate reducing the effective yields of circuits or displays obtained from the substrate.

Thus, it is desirable to reduce contamination of the backside of the substrate to increase substrate yields.

SUMMARY

In one version, a substrate support has a support structure and a coating on the support structure having a carbon-hydrogen network. The coating has a contact surface having a coefficient of friction of less than about 0.3 and a hardness of at least about 8 GPa. The contact surface of the coating is capable of reducing abrasion and contamination of a substrate that contacts the contact surface. In one version, the substrate support has a dielectric covering an electrode and a plurality of mesas on the dielectric. The mesas have a coating of a diamond-like material over a titanium layer.

In another version, a substrate support has a support structure having a ceramic contact surface. The ceramic contact surface has a metal concentration level of less than about $5 \times 10^{12}$ atoms/cm$^2$ of metal to reducing contamination of the substrate.

In yet another version, a substrate heat exchange pedestal has a support structure having a coating of a diamond-like material. The heat exchange pedestal also has a heat exchanger in the support structure that is capable of heating or cooling a substrate.

In yet another version, the heat exchange pedestal has a support structure having a coating of silicon carbide. The coating has a contact surface having a metal contaminant concentration level of less than about $5 \times 10^{12}$ atoms/cm$^2$ of metal. The contact surface that is capable of reducing contamination of the substrate. The heat exchange pedestal also has a heat exchanger in the support structure that is capable of heating or cooling the substrate.

In yet another version, the substrate heat exchange pedestal has a support structure having a coating comprising silicon nitride. The coating has a contact surface having a metal contaminant concentration level of less than about $5 \times 10^{12}$ atoms/cm$^2$ of metal. The contact surface is capable of reducing contamination of the substrate. The heat exchange pedestal also has a heat exchanger in the support structure, the heat exchanger capable of heating or cooling the substrate.

In another version, a shutter to inhibit deposition of material on a surface of a substrate support and to reduce frictional contamination has a metal disc that covers at least a portion of the support surface. The disc has a lower surface having a coating of diamond-like material with coefficient of friction of less than about 0.3 and a hardness of at least about 8 Gpa. The coating is capable of reducing contamination of the support surface by metal particulates when the lower surface contacts the support surface.

In another version, a shutter to inhibit the deposition of material on a surface of a substrate support and to reduce frictional contamination has a metal disc that covers at least a portion of the support surface. The disc has a lower surface having a ceramic coating having less than about $5 \times 10^{12}$ atoms/cm$^2$ of contaminant metal. The lower surface is capable of reducing contamination of the support surface by metal particulates when the lower surface contacts the support surface.

In yet another version, a lift pin assembly to lift a substrate from a support has a plurality of lift pins. Each lift pin has a movable elongated member having a tip with a contact surface to contact the substrate. The contact surface has a diamond-like material.

In another version, a lift pin assembly to lift a substrate from a support has a plurality of lift pins, with each lift pin having a movable elongated member having a tip with a ceramic contact surface to contact the substrate. The ceramic contact surface has a metal contaminant concentration level of less than about $5 \times 10^{12}$ atoms/cm² of metal.

In yet another version, a heat exchange pedestal capable of exchanging heat with a substrate has a metal body having an upper surface. A coating having a contact surface to contact a substrate covers the upper surface of the metal body. A heat exchanger is below the contact surface and is capable of heating or cooling the substrate.

In another version, a method of coating a support component in a plasma zone includes placing a support structure having a surface in the plasma zone. A metal is sputtered to deposit the sputtered metal on the surface of the support structure. A process gas is introduced while sputtering to deposit a chemical vapor deposition material on the surface of the support structure simultaneously with the sputtered metal.

DRAWINGS

These features, aspects, and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1:
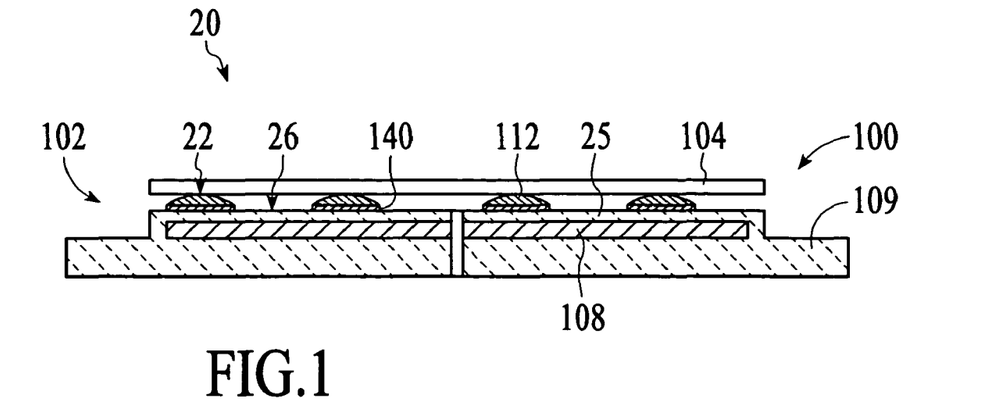
FIG. 1 is a sectional side view of an embodiment of a substrate support having a plurality of mesas comprising a contamination reducing coating.
Figure 2A:
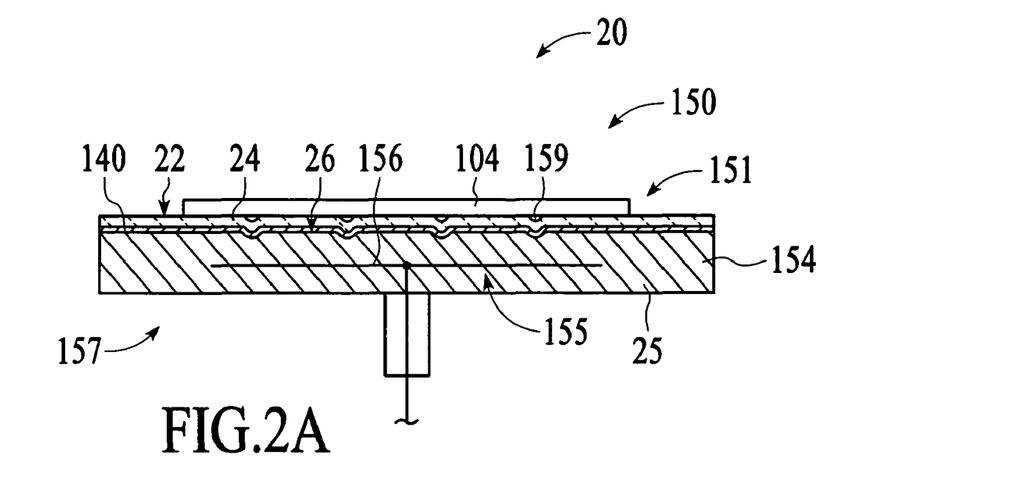
FIG. 2a is a sectional side view of an embodiment of a heating pedestal having a contamination reducing coating.
Figure 2B:
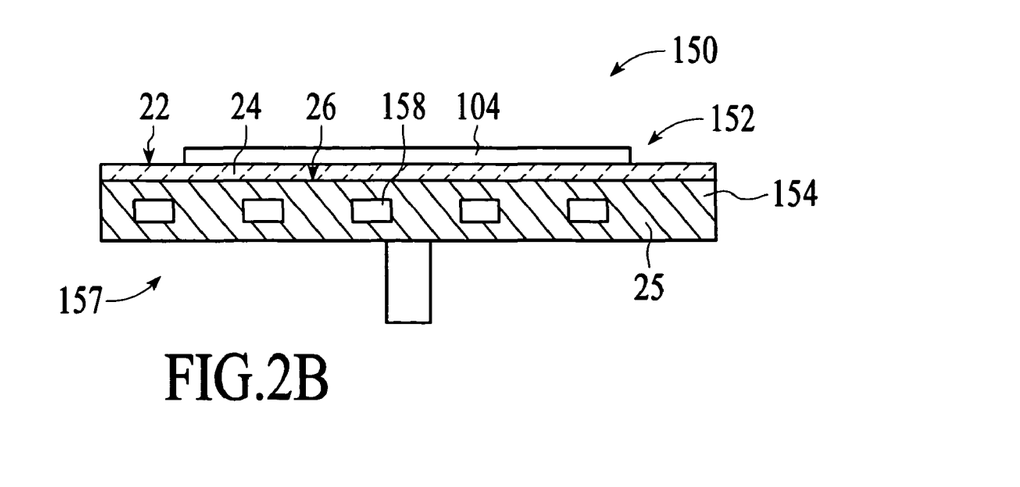
FIG. 2b is a sectional side view of an embodiment of a cooling pedestal with a contamination reducing coating.
Figure 3:
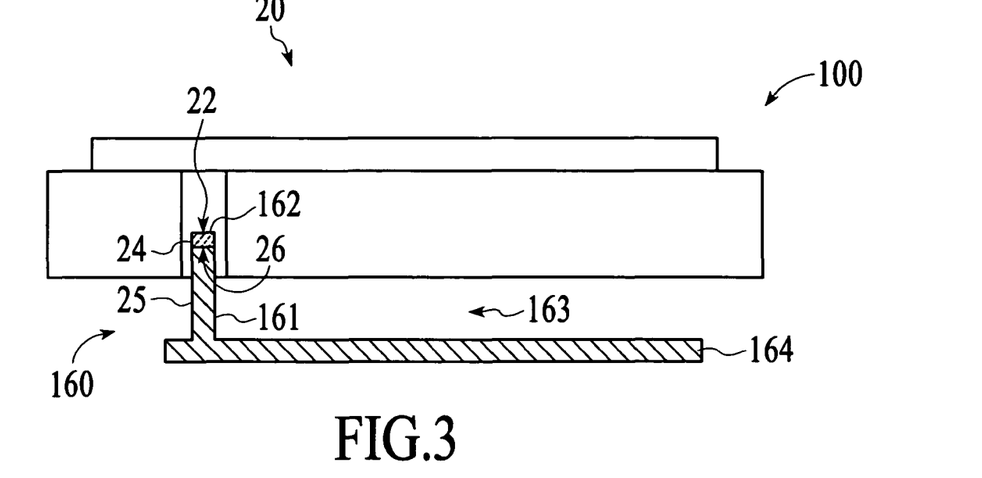
FIG. 3 is a sectional side view of an embodiment of a lift pin assembly having lift pins with a contamination reducing coating.
Figure 4:
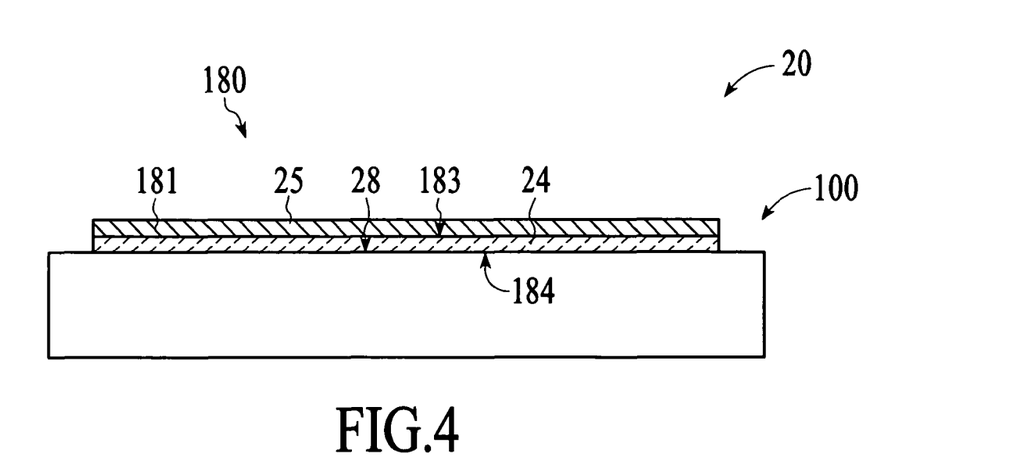
FIG. 4 is a sectional side view of an embodiment of a shutter having a contamination reducing coating.

In the substrate processing methods, substrates 104 are transported and held by various support components 20. For example, a substrate 104 may be held during processing in a chamber 106 on a support component 20 that is a substrate support 100, and which has an support structure 25 that can also serve as an electrostatic chuck 102 as shown in FIG. 1. The substrate 104 may also be supported by a support component 20 comprising a support structure 25 that is a heat exchange pedestal 150, such as a heating pedestal 151 or cooling pedestal 152, as illustrated in FIGS. 2a and 2b, that is used to degas a substrate 104 by heating it, or to cool a substrate 104 after a high temperature process. Further types of support components 20 include support structures 25 suitable for transporting the substrate, such as lift pins 160 as shown in FIG. 3, and robotic arms having robot blades, can be used to place and remove substrates 104 on supports 100, as well as to transfer substrates 104 between chambers 106 in a multi-chamber apparatus 101. Yet another support component 20 is a shutter disk 180, as shown in FIG. 4, to cover a portion of the substrate support 100 when the substrate 104 is not present during a chamber cleaning process. It should be understood that the various embodiments of support components 20 that are described herein are provided to illustrate the invention, and should not be used to limit the scope of the present invention, and that other versions of support components apparent to those of ordinary skill are also within the scope of the present invention.

The processing yields of substrates 104 is substantially improved with support components 20 having contact surfaces 22 capable of reducing, and even eliminating, the formation and/or deposition of contaminant residues that arise from frictional and abrasive forces between the contact surface 22 of the support component 20 and the substrate 104. For example, when the component 20 is made from a metal containing material, metal contaminant particles deposit on the substrate 104 when the substrate 104 rubs against the contact surface 22 of the support component 20. It has been found that the frictional residues have larger particle sizes or numbers, when the contact surface 22 is excessively soft, has a high frictional coefficient causing abrasion of the surfaces, or has a high level of impurities. To reduce such contamination, the contact surfaces 22 of the support component 20 are provided with a surface coating 24 that has desirable abrasion or hardness, frictional properties, and/or low-levels of contaminants. The contamination reducing coating 24 may cover at least a portion of a surface 26 of an underlying component structure 25, as shown for example in FIG. 2a, or may even cover substantially the entire surface that is in contact with the substrate 104. The coating 24 is also sufficiently thick to protect the substrate 104 from contamination by the underlying support structure, for example the coating 24 may comprise a thickness of from about 0.1 microns to about 1000 microns, such as from about 1 to about 20 microns.

In one version, the contamination reducing coating comprises a material having a coefficient of friction that is sufficiently low to reduce the formation and deposition of friction or abrasion resulting particulates on the substrate 104. The low-friction material can improve substrate processing yields by contacting the substrate 104 only with a low-friction material that is less likely to flake or "rub-off" the surface 22 and deposit onto the substrate 104. The low-friction material suitable for the surface 22 desirably comprises a coefficient of friction of less than about 0.3, such as from about 0.05 to about 0.2. The coefficient of friction is the ratio of the limiting frictional force to the normal contact force when moving the surface 22 relative to another surface. By comparison, a supporting surface of a heating pedestal 151 made of stainless steel, and without the aforementioned coating, can have a coefficient of friction of at least about 0.7. The contamination reducing coating further comprises a low average surface roughness, such as for example, an average surface roughness of less than about 0.4 micrometers. The lower surface roughness makes the contact surface 22 of the coating less likely to catch or tear out the substrate 104 when the substrate is transferred onto or off the contact surface 22.

The contamination reducing coating also desirably has a high hardness to provide better resistance to scratching and abrasion by the substrate 104. When the substrate is a relatively hard material, it is desirable for the contact surface 22 to also be composed of a material having a relatively high hardness to be less likely to generate loose particles or flakes due to scratching of the surface 22. A suitable contamination reducing coating may comprise a hardness of at least about 8

GPa, such as from about 8 Gpa to about 25 Gpa, and even at least about 10 GPa, such as from about 18 Gpa to about 25 GPa. The surface 22 desirably comprises a hardness that is selected with respect to the substrate 104 being processed. For example, the surface 22 of a component for processing a substrate 104 comprising a semiconductor wafer may have a hardness that is different than the hardness of a surface 22 for processing a substrate 104 comprising a dielectric glass panel used for displays.

The hardness of the surface 22 can be measured by, for example, a hardness load and displacement indentation test. A suitable instrument for performing the hardness test may be, for example, a "Nano Indenter II" available from Nano Instruments, Inc. in Oak Ridge, Tenn. In this test, the tip of an indenter probe is placed against the surface 22, and a load is applied to the indenter probe that presses the tip into the surface 22 and forms an indentation in the surface 22. The tip of the indenter probe can be, for example, pyramidal shaped, and a suitable load may be in the microgram range. The hardness of the surface 22 can be found by evaluating the indentation, for example, by taking a ratio of the force applied to the indenter probe divided by the area of the indentation that results from the force, as described for example in *Review of Instrumented Indentation* in the *Journal of Research of the National Institute of Standards and Technology*, Vol. 108, No. 4, July-August 2003, which is herein incorporated by reference in its entirety. The area of the indentation can be calculated, for example, optically or by monitoring a depth of the indenter probe in the surface and using a known geometry of the tip of the indenter probe.

It is further desirable for the contact surface 22 to have low levels of contamination-reducing metals that have a high purity with a low concentration of impurities, especially metal impurities such as Fe, Cr, Ni, Co, Ti, W, Zn, Cu, Mn, Al, Na, Ca, K and B. The metal impurities can rub off on and migrate from the surfaces of supporting components and into the substrates to contaminate the substrates. Suitable contamination reducing coatings have a metal concentration level of less than about $5 \times 10^{12}$ atoms/cm$^2$ of metal atoms at the surface 22 of the coating, or even less than about $5 \times 10^{10}$ atoms/cm$^2$ of metal atoms. The contamination-reducing material is also desirably resistant to corrosion by energized process gases. While a coating comprising a ceramic material having the desired low levels of metal atoms can be applied to a metal or ceramic support structure to reduce its contaminating effect on a substrate, the surface of a ceramic support component, such as ceramic electrostatic chuck having an embedded electrode can also be treated to clean the surface to reduce the contaminant levels of the surface.

The contamination reducing coating 24 can also be tailored to have provide good adhesion to the underlying support structure 25 by controlling, for example, the coating thickness, coefficient of thermal expansion, or tensile strength. For example, the coating 24 comprising the contamination reducing coating desirably comprises a thermal coefficient of expansion that is sufficiently matched to the expansion coefficient of the underlying component 22 to reduce cracking or spalling of the coating 24 from the component 22. A coefficient that is too high or too low can result in cracking and de-lamination of the coating 24 from the structure as a result of unequal expansion/contraction rates of the coating and underlying structure materials during heating or cooling of the component 22. The thickness of the coating 24 can also affect the adhesion of the coating 24. For example, for an underlying structure comprising aluminum nitride, a suitable coating 24 comprising the contamination reducing coating may comprise a coefficient of thermal expansion of from about 4 ppm to about 6 ppm per degree Celsius. For an underlying structure comprising a metal such as aluminum or stainless steel, a suitable coating 24 of contamination reducing coating may comprise a similar coefficient of thermal expansion of from about 4 ppm to about 6 ppm, and may also comprise a reduced thickness to inhibit spalling of the coating 24.

In one version, the contamination-reducing material comprises a diamond-like material, such a diamond-like carbon (also referred to as DLC.) Diamond-like materials are carbon-based materials with a network of carbon and hydrogen atoms. They typically have a significant fraction of sp$^3$ hybridized carbon, such as at least about 50% sp$^3$ hybridized carbon to at least about 98% sp$^3$ hybridized carbon. Thus, many of the carbon atoms in the network are be bonded to other carbon or hydrogen atoms in several directions, similar to diamond, as opposed to being substantially limited to bonding to atoms that are in the same plane, as in graphite. However, the bonded carbon atoms have only a short range order in the form of micro-crystals or crystallites, and typically do not form a full three-dimensional crystalline lattice of diamond having a long range order. Depending on the fabrication conditions, the diamond-like materials can be amorphous or can contain crystallites with nanoscale sizes. The diamond-like materials can also contain a significant amount of hydrogen, such as a content of at least about 2 atom % of hydrogen, for example from about 2 atom % to about 25 atom % of hydrogen. Diamond-like carbon (DLC) also has a high hardness and a low coefficient of friction that can reduce the contamination of substrates 104 from surfaces 22 having the materials. For example, the diamond-like carbon material can have a hardness of at least about 18 GPa, such as from about 18 GPa to about 25 GPa. The coefficient of friction of the surface of the diamond-like carbon is also desirably low, such as a coefficient of less than about 0.3, such as from about 0.05 to about 0.2. The diamond-like carbon material can also comprise a low surface roughness, such as an average surface roughness of less than about 0.4 micrometers, such as from about 0.05 to about 0.4 micrometers. The diamond like-carbon can also be manufactured with a low amount of metal impurities, such as less than about $5 \times 10^{12}$ atoms/cm$^2$ of metal impurities, and even less than about $5 \times 10^{11}$ atoms/cm$^2$ of metal atoms. For example, the material can comprise a concentration of titanium atoms of less than about 10 atom %, and even less than about 6 atom % of titanium. Thus, diamond-like materials such as diamond-like carbon provide characteristics such as a low coefficient of friction, high hardness and high purity that are desirable for contamination-reducing materials on surfaces 22.

In one version, the diamond-like carbon materials are formed as coatings 24 over underlying components surfaces 26 to provide a metal contamination reducing component surface. A coating 24 of the diamond-like carbon materials can be formed by methods including chemical vapor deposition, carbon ion beam deposition, ion-assisted sputtering from graphite and laser ablation of graphite. An example of a method of depositing a diamond-like carbon coating layer by a chemical vapor deposition method is described in U.S. Pat. No. 6,228,471 to Neerinck et al, PCT filed Jan. 23, 1998, assigned to N.V. Bekaert S.A., which is herein incorporated by reference in its entirety. The fabrication process can be controlled to tailor the properties of the resulting coating. For example, the fabrication conditions can be controlled to tailor the amount of hydrogen incorporated into the coating 24. Also, the fabrication conditions can be controlled to tailor the electrical properties of the coating 24, for example to provide electrical properties that may be desirable for an electrostatic chuck 102. For example, the electrical resistivity of the coating 24 can be controlled by controlling the proportion of $sp^3$ to $sp^2$ hybridized carbon atoms. A higher proportion of $sp^3$ hybridized carbon atoms gives a higher resistivity, while a higher proportion of $sp^2$ hybridized carbon atoms gives a lower resistivity.

In another version, the contamination reducing coating can comprise a diamond-like material comprising a diamond-like nanocomposite having both (i) networks of carbon and hydrogen, and (ii) networks of silicon and oxygen. The diamond-like nanocomposite is similar to the diamond like carbon, in that it comprises a network of bonded carbon atoms of which a substantial fraction are $sp^3$ hybridized but does not have a substantially long-range order as in pure diamond, and can further comprise bonded hydrogen atoms. Depending on the fabrication conditions, the diamond-like nanocomposite can be fully amorphous or can contain diamond crystallites, for example, at the nanoscale level. The diamond-like nanocomposite comprises a networks of silicon bonded oxygen that interpenetrate the carbon networks in a substantially random fashion, to form a composite material having high temperature stability, high hardness and a low coefficient of friction. The percentage of each of C, H, Si and O atom in the nanocomposite can be selected to provide the desired composition characteristics. A suitable diamond-like nanocomposite may comprise a composition of, for example, from about 50 atom % to about 90 atom % carbon, from about 5 atom % to about 10 atom % hydrogen, from about 10 atom % to about 20 atom % silicon and from about 5 atom % to about 10 atom % oxygen. The diamond-like nanocomposites may comprise a low coefficient of friction of less than about 0.3, such as from about 0.05 to about 0.2, and a low average surface roughness of less than about 0.4 micrometers, such as from about 0.05 micrometers to about 0.4 micrometers, and even less than about 0.1 micrometers. The diamond-like nanocomposite may also comprise a microhardness of at least about 8 GPa, such as from about 8 to about 18 GPa. The diamond-like nanocomposite may also comprise a high purity, for example, the diamond-like nanocomposite can comprise less than about $5 \times 10^{12}$ atoms/cm$^2$ and even less than about $5 \times 10^{11}$ atoms/cm$^2$ of metal impurities. For example, the material can comprise less than about 10 atom % of metal impurities such as titanium, and even less than about 7 atom % of titanium.

The diamond-like nanocomposite can be formed by methods similar to those described for diamond-like carbon materials, including by a chemical vapor deposition method, and can be formed as a coating 24 on the component 20. Examples of methods of forming diamond-like nanocomposite coatings is described, for example, in U.S. Pat. No. 5,352,493 to Dorfman et al, filed Oct. 4, 1994, assigned to Veniamin Dorfman, and U.S. Pat. No. 6,228,471 to Neerinck et al, PCT filed Jan. 23, 1998, assigned to N.V. Bekaert S.A., both of which are herein incorporated by reference in their entireties. The diamond-like nanocomposite material can also be commercially available materials such as DLN or Dylyn® from Bekaert Advanced Coating Technologies, Belgium.

The diamond-like materials, including diamond-like carbon and diamond-like nanocomposites, can also be tailored by incorporating metal additives into the materials. The metal additives can be added to provide desired properties, such as a desired electrical resistivity or conductance of the material. The metal additives are distributed about the diamond-like material, and may even form a separate bonded metal network that interpenetrates at least one of the carbon and a silicon networks. Suitable metal additives may comprise, for example, at least one of B, Li, N, Si, Ge, Te, Mo, W, Ta, Nb, Pd, Ir, Pt, V, Fe, Co, Mg, Mn, Ni, Ti, Zr, Cr, Re, Hf, Cu, Ag and Au. The diamond-like material can comprise from about 0.1 atom % to about 10 atom % of the metal additive, such as for example, titanium. The diamond-like material having the metal additives also comprises a relatively low coefficient of friction and relatively high hardness. For example a diamond-like nanocomposite comprising C:H and Si:O networks having metal additives can comprise a coefficient of friction of less than about 0.3, such as from about 0.05 to about 0.2. The diamond-like nanocomposite with metal additives can also have a microhardness of at least about 12 GPa, such as from about 12 to about 18 GPa. The metal additives can be introduced into the diamond-like networks by co-depositing the metals with the diamond-like material, or by another suitable fabrication method. Examples of metal additive incorporation methods are described in U.S. Pat. Nos. 5,352,493 and 6,228,471, which are incorporated by reference in their entireties above.

Figure 7A:
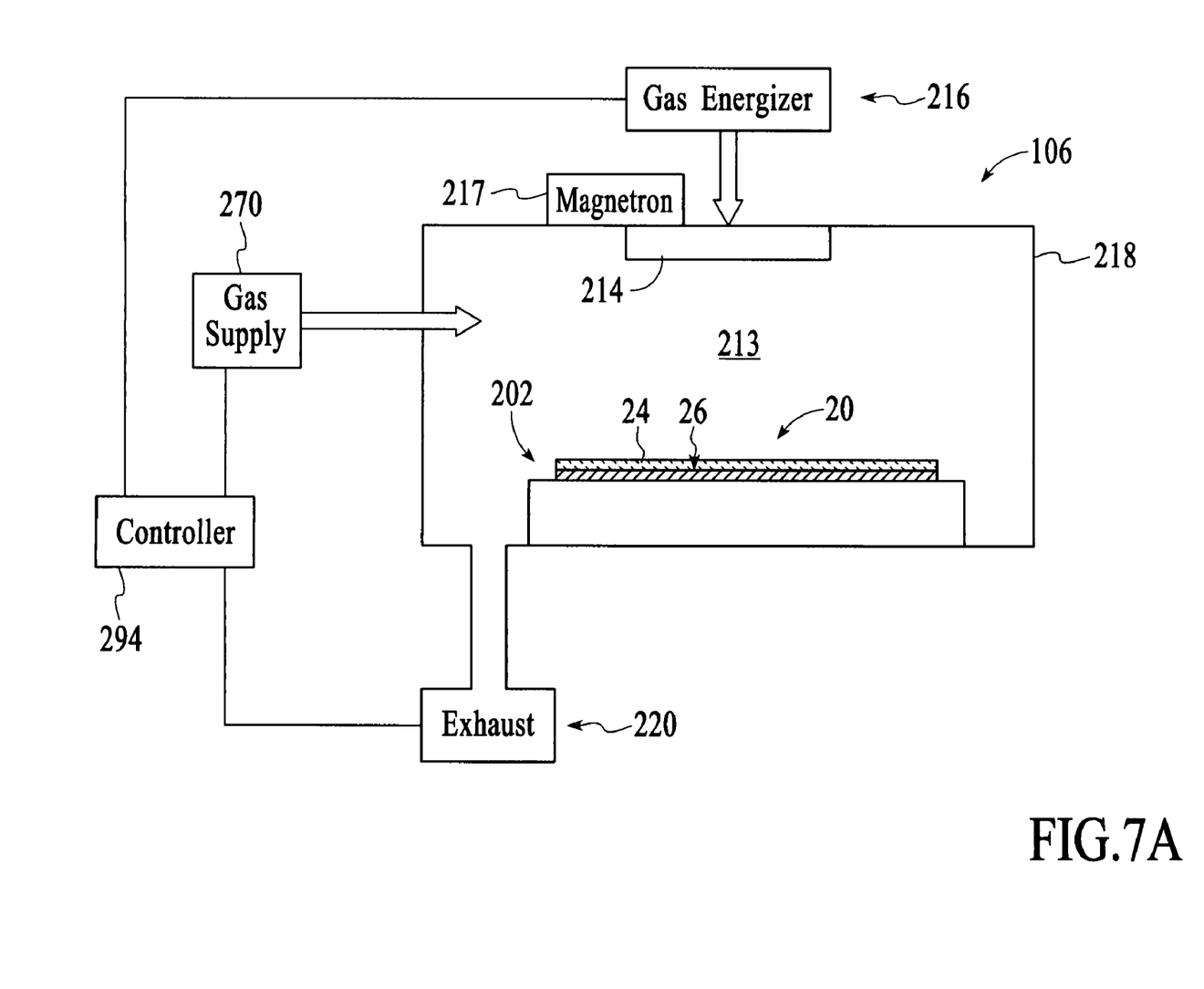
FIG. 7a is a sectional side view of an embodiment of a component processing chamber.

In one version of a method of forming a coating 24 comprising a diamond like material, a component structure 25 is placed in a plasma zone 213 of a process chamber, and embodiment of which is shown in FIG. 7a. The chamber 106 comprises chamber walls 218 enclosing the plasma zone 213. The component 20 can be held on a support 202 in the chamber 106. A process gas supply 270 provides a deposition gas into the chamber 106, and can comprise a gas source, one or more conduits leading from the source to the chamber, flow meters, and one or more gas inlets in the chamber 106. The process gas comprises at least a carbon-containing compound, such as a carbon-containing gas, that is capable of forming bonded carbon networks in the coating 24. The process gas can also comprise a hydrogen-containing compound, such as a hydrogen-containing gas. For example, the process gas can comprise a gas comprising both carbon and hydrogen atoms, such as at least one of methane, propane, acetylene, butane and ethelyne. To form a diamond like nanocomposite comprising a network of silicon and oxygen, the process gas can further comprise a silicon-containing compound. For example, the process gas can comprise hexamethyldisiloxane or polyphenylmethylsiloxane, as described for example in U.S. Pat. No. 5,638,251 to Goel et al, filed on Oct. 3, 1995 and assigned to Advanced Refractory Technologies, which is herein incorporated by reference in its entirety. The process gas can further comprise an additive gas, such as for example argon.

A gas energizer 216 energizes the process gas to form an energized gas in the process zone 213 that deposits a diamond like material on the component surface 26 by plasma enhanced chemical vapor deposition. For example, the gas energizer 216 can decompose a process gas comprising carbon, hydrogen, silicon and oxygen containing compounds to deposit a chemical vapor deposition material comprising a diamond like nanocomposite on the surface 26. The gas energizer 216 can comprise, for example, one or more of an inductor antenna and electrodes that are capable of coupling RF energy to form the energized gas. An exhaust 220 can be provided to exhaust gases from the chamber, and can comprise an exhaust port leading to an exhaust pump, and a throttle valve to control the pressure in the chamber 106. A controller 294 can controls the components of the chamber 106 to deposit the coating 24 on the component 20.

In one version, the chamber 106 comprises a target 214 having a metal material that can be sputtered from the target 214 by the energized gas to co-deposit the sputtered metal on the surface 26 simultaneously with the chemical vapor deposited material, to form a diamond like material having a metal additive. In this version, the diamond-like material is co-deposited with the metal additive by a process combining physical vapor deposition of the metal additive in the plasma enhanced chemical vapor deposition environment. The target 214 can comprise a metal material comprising, for example, at least one of titanium and tungsten. In one version, the target 214 acts as a part of the gas energizer 216 and can be electrically biased to induce sputtering of the target material. A magnetron 217 comprising a magnetic field generator can also be provided as a part of the gas energizer 216. A power applied to the magnetron 217 can energize and maintain a density of the gas to sputter material from the target 214. The metal material can also be co-deposited in the coating 24 by methods other than sputtering, such as for example by thermal evaporation of a metal source, or by a metal ion beam.

In one version, a component 20 comprising the coating 24 having the diamond-like material can be refurbished, for example in the chamber embodiment shown in FIG. 7a, after processing a number of substrates 104. The coating 24 can be refurbished to repair or replace portions of the coating 24 that may have eroded during substrate processing, for example by exposure to an energized gas. A cleaning step may also be performed to remove any residual coating from the surface 26. For example, the surface may be cleaned with a chemical solution that dissolves the coating, or the coating can be grit blasted from the surface 26. In another version of a cleaning process, the residual coating can be removed by a reactive ion etching process in which the residual coating is exposed to an energized etching gas to etch away the remaining coating 24. In the refurbishment process, a coating 24 comprising the diamond-like material is re-deposited on the surface 26 of the component 20, for example by the method described above, including by co-depositing a chemical vapor deposition material simultaneously with a sputtered metal.

In yet another version, a coating 24 comprising a diamond-like nanocomposite comprising C:H and Si:O networks can be treated to seal the surface 22 of the coating 24. For example, the surface 22 of the coating 24 can be exposed to an oxygen-containing reactant, such as water vapor, that reacts with carbon atoms in the diamond-like material to form gaseous products, such as for example CO and $CO_2$. The gaseous products leave the surface 22, providing a "densified" diamond-like surface material having a higher silicon content and a reduced amount of carbon. For example, the surface 22 of the coating 24 may comprise at least about 90 atom % of Si and O. The "densified" surface 22 acts as a sealant against further moisture, and provides improved processing performance of the component having the coating 24.

In another version, the contamination reducing coating comprises a high-purity ceramic having characteristics that reduces the contamination of substrates 104 from surfaces 22 having the high-purity material. In one version, the contamination-reducing material comprising the high-purity ceramic comprises high-purity silicon carbide. The contamination-reducing silicon carbide material comprises a purity of at least about 99% and even at least about 99.999%, and can comprise less than about $5 \times 10^{12}$ atoms/cm$^2$ to less than about $5 \times 10^9$ atoms/cm$^2$ of metal atoms, such as less than about $5 \times 10^{10}$ atoms of metal atoms per cm$^2$. The silicon carbide material also desirably comprises a high density, such as a density of from about 98% to about 100% of the theoretical density, such as at least about 99% of the theoretical density. The surface 22 comprising the metal contamination reducing silicon carbide material can also be polished to provide a low coefficient of friction of less than about 0.3, such as from about 0.05 to about 0.2, and can provide a substantially smooth surface having a low surface roughness, such as an average surface roughness of less than about 0.2 micrometers.

Suitable contamination-reducing silicon carbide materials can be fabricated by, for example, a high purity silicon carbide sintering method, as described for example by U.S. Pat. No. 6,001,756 to Takahashi et al, filed on May 9, 1997 and assigned to Bridgestone Corporation, which is herein incorporated by reference in its entirety. For example, the contamination-reducing silicon carbide material can comprise a coating 24 having a layer of high-purity sintered silicon carbide. Also, a coating of high purity silicon carbide can be deposited onto the surface 26 of a component 20, for example by a chemical vapor deposition method which reacts carbon and silicon-containing precursors to form a deposited silicon carbide coating. A coating 24 can also be formed by, for example, thermochemical conversion of a carbonaceous material, such as graphite, with a reactant containing silicon, an example of which conversion is described in U.S. Pat. No. 5,705,262 to Bou et al., filed on Oct. 26, 1994, and assigned to Le Carbone Lorraine, which is herein incorporated by reference in its entirety.

In another version, a contamination reducing material comprises a high-purity ceramic comprising silicon nitride. The high-purity silicon nitride material may have the desired contamination-reducing characteristics, such as less than about $5 \times 10^{12}$ atoms/cm$^2$ of contaminate metals, and even less than about $5 \times 10^{10}$ atoms/cm$^2$ of contaminate metals. The silicon nitride material may also have a density of from about 98% of the theoretical density to about 100% of the theoretical density, such as at least about 99% of the theoretical density. The high-purity silicon nitride material may have a coefficient of friction of less than about 0.3, such as from about 0.05 to about 0.2, and a hardness of from about 10 GPa to about 18 GPa, such as at least about 16 GPa. Furthermore, the silicon nitride surface may be polished to provide a surface roughness average of less than about 0.4 micrometers. Also, a coating 24 comprising the metal contamination-reducing $Si_3N_4$ can exhibit good adhesion to metal surfaces such as stainless steel even at temperatures of at least about 550°. The surface 22 comprising the silicon nitride may comprise a silicon nitride coating 24, such as for example a coating 24 formed by a chemical vapor deposition process.

Other high-purity ceramic materials that may serve as contamination reducing coatings can comprise, for example, at least one of silicon and silicon oxide. The silicon and silicon oxide materials have a high purity with less than about $5 \times 10^{12}$ contaminant metals per cm$^2$. The materials are also desirably polished to provide the desired coefficient of friction of less than about 0.3, and an average surface roughness of less than about 0.4 micrometers.

Figure 5:
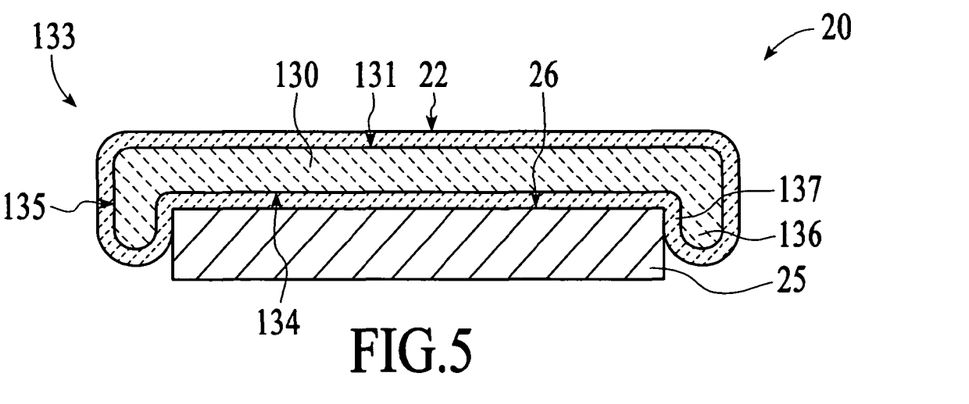
FIG. 5 is a sectional side view of an embodiment of a component having a protective cap comprising a base layer covered by a contamination reducing coating.

In one version, a coating 24 comprising a contamination reducing coating can coat a base layer 130 that covers a surface 26 of a component 20 to form a protective cap 133, as shown for example in FIG. 5. The cap 133 provides protection of the underlying component structure 25, while providing a contamination reducing surface 22 that reduces contamination of substrates 104. The cap 133 can also comprise a conformal ledge 136 that covers a peripheral edge 137 of the underlying structure 25 to protect the structure 25. In one version, the cap 133 comprises a coating 24 having a high-purity silicon carbide layer that is formed over the graphite base layer 130, for example by chemical vapor deposition or thermochemical conversion of the surface of the graphite base layer 130, to provide a coating surface 22 having the contamination-reducing materials. In another version, the cap 133 comprises a base layer 130 comprising a metal infiltrated silicon carbide material that is coated by a high-purity silicon carbide coating 24. The infiltrated silicon carbide base layer 130 is formed by infiltrating the pores of a porous sintered silicon carbide material with a metal, such as silicon metal. For example, the silicon metal can be infiltrated to provide a volume percent of from about 20% to about 80% of the base layer material. A coating 24 comprising silicon carbide is formed over the base 130 comprising the infiltrated silicon carbide material by, for example, chemical vapor deposition, to form a high purity silicon carbide layer that reduces contamination. Alternatively, the cap 133 may be substantially entirely made from silicon carbide, such as sintered silicon carbide, to form the coating 24, or may have a sintered silicon carbide base layer 130 covered by a silicon carbide coating 24.

In one version, the cap 133 comprises a base layer 130 that is substantially entirely covered by the coating 24, as shown for example in FIG. 5. In this version, the coating 24 can cover a top surface 131, bottom surface 134 and even a side surface 135 of the base layer 130. Providing such a coating 24 can be beneficial because thermal stresses that can develop between the coating 24 and base layer 130 can be reduced. For example, during a cooling step performed after applying the coating 24 by a chemical vapor deposition method, differences in the thermal expansion coefficient of the coating 24 and base layer 130 can cause stresses that could induce bowing or other deformation of the coating surface 22. By applying the coating 24 to the bottom surface 134 of the base layer 130 as well as the top surface 131, the stresses at the top surface 131 can be at least in part compensated for, to even out the stresses at the top and bottom surfaces 131, 134 and reduce the deformation of the coating surface 22.

In one version, an adhesion layer 140 is provided to secure the coating 24 comprising the contamination-reducing material to the underlying component structure. For example, as shown in FIGS. 1 and 2, the adhesion layer 140 may be applied to the upper surface 26 of the component 22, and the coating 24 may be formed thereover to adhere the coating 24 to the surface 26. For example the adhesion layer 140 can comprise at least one of titanium, aluminum, zirconium and chromium. In one version, the adhesion layer 140 comprises a metal such as titanium that bonds well to both metal and non-metallic materials. The adhesion layer 140 can comprise a thickness of, for example, from about 0.25 to about 4 microns. The coating 24 and the cap 133 can also be mechanically affixed to the underlying component structure 25, for example with connector pins.

In one version, a component 20 having the contamination reducing material comprises a support structure 25 comprising a substrate support 100 having an electrostatic chuck 102, and embodiment of which is shown in FIG. 1. The electrostatic chuck 102 comprises an electrode 108 at least partially covered by a dielectric body 109, and may even be substantially entirely covered by the dielectric body 109. The electrode 108 is chargeable by a voltage supply to electrostatically hold a substrate 104 on the chuck 102. In one version, the dielectric body 109 comprises a dielectric material having a relatively low resistivity of below about $10^{12}$ Ohms·cm, such as for example at least one of aluminum nitride, and boron nitride. The relatively low-resistivity dielectric body can promote a Johnson-Rahbek effect to hold the substrate on the chuck 102, by allowing electric charge to at least partially migrate through the dielectric body 109 to hold the substrate 104. Other low-resistivity dielectric materials suitable for the dielectric body can include, for example, aluminum oxide doped with at least one of titanium oxide and chromium oxide.

The electrostatic chuck 102 comprises a plurality of mesas 112 on an upper surface 26 of the dielectric body 109 that support the substrate 104. The plurality of mesas 112 can be shaped and distributed to provide an optimum electrostatic chucking force, and can also provide a desired heat transfer gas flow distribution to upper surface of the dielectric body. For example, the mesas 112 can be arranged in spaced-apart, concentric rings on the upper surface 26. The composition of the mesas 112, as well as the height and width of the mesas 112, can also be selected to provide the desired electrostatic chucking force. For example, the mesas 112 can comprise a dielectric material having a relatively high resistivity, to form a hybrid Johnson-Rahbek electrostatic chuck. An example of a hybrid Johnson-Rahbek electrostatic chuck having supporting mesas 112 is described in U.S. Pat. No. 5,903,428 to Grimard et al, filed on Sep. 25, 1997 and commonly assigned to Applied Materials, which is herein incorporated by reference in its entirety. The mesas 112 can also comprise a conductive material such as a metal-containing material with low resistivity, such as a TiAlN material as described for example in Taiwan Patent No. 0466667 to Tsai, filed on Jun. 29, 2000 and commonly assigned to Applied Materials, which is herein incorporated by reference in its entirety.

In one version, the mesas 112 comprise a coating 24 having at least one of the contamination-reducing materials described above. For example, substantially the entire mesa 112 can comprise the coating 24 formed from a contamination-reducing material. A suitable height of mesas 112 that substantially entirely comprise the contamination-reducing material may be from about 0.25 micrometers to about 6 micrometers. Alternatively, the mesa 112 can comprise a surface coating 24 of the contamination-reducing material that overlies the rest of the mesa 112. The mesas 112 can comprise a contamination-reducing material comprising at least one of a diamond like material, such as for example diamond-like carbon, a diamond-like nanocomposite, and a metal-containing diamond-like material. The mesas 112 can also comprise a contamination-reducing material comprising a high-purity ceramic, such as at least one of the silicon carbide, silicon nitride, silicon and silicon oxide materials described above. The mesas 112 can also comprise an adhesion layer 140, for example comprising titanium, that improves adhesion of the coating 24.

In one version, the mesas 112 comprise a diamond-like material, such as diamond-like carbon or a diamond-like nanocomposite material, that is tailored to provide a desired resistivity, such as a resistivity of from about $10^2$ Ohms·cm to about $10^{10}$ Ohms·cm. For example, the mesas 112 may comprise a diamond-like material having the proportion of sp2 hybridized carbon atoms selected to provide an electrical resistivity of the mesa 112 of from about $10^4$ Ohms·cm to about $10^8$ Ohms·cm, such as a percent of sp2 hybridized carbon atoms of from about 5% to about 10%. As another example, the concentration of metal additive in the diamond-like material can be varied to provide the desired resistivity of the material. For example, a suitable diamond-like material may comprise from about 1 to about 10 atom % of a metal additive such as titanium, to provide a resistivity of from about $10^4$ to about $10^8$ Ohm·cm, such as about $10^6$ Ohm·cm.

In another version, the mesas 112 comprise a high-purity ceramic, such as at least one of silicon carbide, silicon nitride, silicon and silicon oxide, and the surface 22 of the mesas 112 can be polished to provide a low average surface roughness, to reduce contamination of the substrate 104 from the surface. The average surface roughness of the mesa surface 22 can be relatively low, as the electrostatic chucking force holds the substrate 104 on the support 100. For example, the surface 22 of the mesas 112 comprising the high-purity ceramic, such as for example silicon nitride, may comprise an average surface roughness of less than about less than about 0.4 micrometers, and even less than about 0.1 micrometers.

In another version, a component 20 comprising the contamination-reducing material comprises a support structure 25 comprising a heat exchange pedestal 150, such as for example a heating pedestal 151, an embodiment of which is shown in FIG. 2a, or a cooling pedestal 152, an embodiment of which is shown in FIG. 2b. The heat exchange pedestal is adapted to exchange heat with the substrate 104 to provide a desired temperature of the substrate 104. For example, a heating pedestal 151 may heat a substrate 104 to remove or de-gas contaminant materials from the substrate 104 before processing of the substrate. The cooling pedestal 152 may cool the substrate 104 to a desired temperature, such as a temperature that is suitable for handling the substrate after processing. The heat exchange pedestal 150 comprises a thermally conductive pedestal body 154 adapted to exchange heat with the substrate 104, and a receiving surface 22 to receive a substrate. The heat exchange pedestal 150 further comprises a heat exchanger 157 comprising at least on of a heater 155 and conduits 158 through which a heat exchange fluid can be flowed. In one version, the pedestal body 154 comprises a metal material, such as at least one of stainless steel, aluminum and titanium. For example, a suitable heat exchange pedestal 151 may comprise a pedestal body 154 comprising stainless steel, and a suitable cooling pedestal 152 can comprise a pedestal body 154 comprising aluminum.

Figure 6:
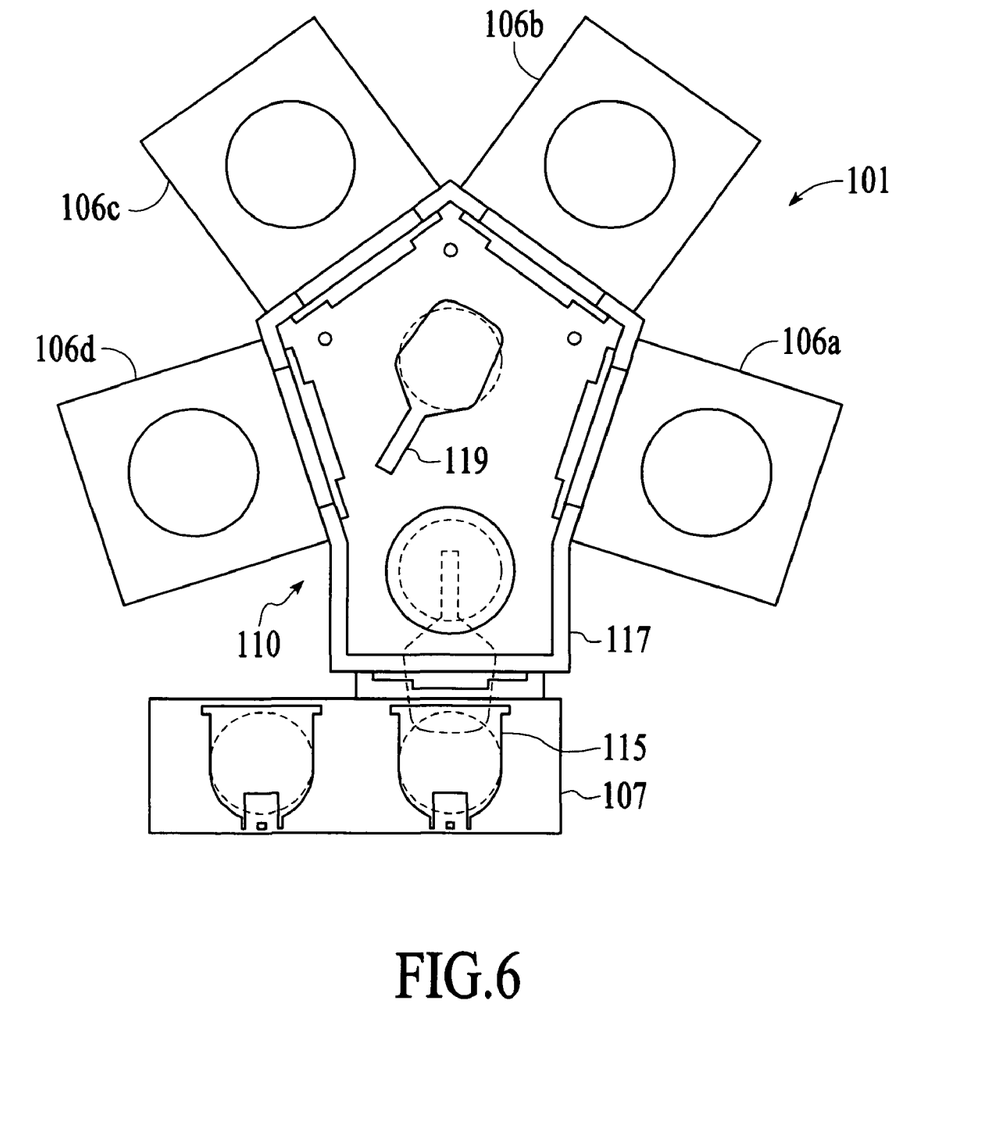
FIG. 6 is a sectional top view of an embodiment of multi-chamber apparatus.

A heating pedestal 151 further comprises a heater 155, such as a resistive heater, or conduits (not shown) through which a heated fluid can be flowed. The heating pedestal can also be heated by overhead heating lamps (not shown.) The heating pedestal may be capable of heating the substrate 104 to a temperature of at least about 200° C. to at least about 400° C. The cooling pedestal 152 can typically comprise cooling conduits 158 through which a cooled fluid can be flowed to cool the substrate 104. The cooling pedestal may be capable of cooling the substrate 104 to a temperature of less than about 80° C. One or more of the heating and cooling pedestals 151,152 may be located in a separate chamber in an integrated vacuum multi-chamber system, an example of which is shown in FIG. 6, to provide the desired heat treatment or cooling of the substrate before or after processing of the substrate 104 in a process chamber 106.

In one version, the heat exchange pedestal 150 comprises the coating 24 comprising at least one of the contamination reducing coatings. For example, the heat exchange pedestal 150 can comprise a coating 24 comprising at least one of a diamond-like material and a high-purity ceramic material. The coating 24 can be formed over an upper surface 26 of the pedestal body 154 to protect the substrate 104, and can even cover substantially the entire upper surface 26 of the pedestal body 154. Also, the coating 24 can be provided as a part of a protective cap 133 that covers the surface 26, as shown in FIG. 5. A thickness of the coating 24 is selected to inhibit migration of the heating body materials to the substrate 104, while also providing good heating of the substrate 104. For example, a suitable thickness of the coating 24 may be from about 0.25 micrometers to about 6 micrometers. The adhesion layer 140 may be provided on the surface 26 of the heat exchange pedestal 150 to secure the coating 24 to the pedestal 150. A suitable thickness of the adhesion layer 140, such as a layer comprising titanium, may be from about 0.25 micrometers to about 1 micrometer. In one version, the heat exchange pedestal 150 comprises a coating 24 of a diamond-like material. In another version, the heat exchange pedestal comprises a coating 24 of high-purity silicon carbide. In another version, the heat exchange pedestal comprises a coating 24 of high-purity silicon nitride. In yet another version, the heat exchange pedestal 150 comprises a cap 133 having a base layer 130 comprising graphite or silicon infiltrated silicon carbide, and a coating 24 of silicon carbide that substantially entirely covers the base layer 130.

Furthermore, as the heat exchange pedestal 150 typically exchanges heat with the substrate 104 substantially without electrostatically holding the substrate 104, the support surface 22 may be tailored to improve retention of the substrate 104 on the surface 22. For example, the surface 22 of the coating 24 on the heat exchange pedestal 150 may comprise a slightly higher average surface roughness than the surface of mesas 112 on an electrostatic chuck. However, the surface roughness is desirably maintained low enough to inhibit contamination of the substrate 104. A suitable average surface roughness may be less than about 0.4 micrometers, such as from about 0.1 micrometers to about 0.4 micrometers.

In one version, the retention of the substrate 104 is improved by forming grooves 159 in the surface 22. The grooves 159 may comprise, for example radially spaced circular grooves. In one version, the surface 22 comprises 4 grooves spaced at least about 1 cm apart, and having a depth of from about 50 micrometers to about 500 micrometers, and a width of from about 1 millimeter to about 3 millimeters. In one version, the grooves 159 are formed by machining or otherwise forming grooves in surface 26 of the pedestal body 154. A conformal coating 24 of the contamination reducing coating is applied to the surface 26 of the pedestal body 154, resulting in a coating 24 having a grooved upper surface. An adhesion layer 140 may also be applied before the conformal coating 24 is formed. Providing grooves 159 may be especially advantageous for materials such as the diamond-like materials, which are typically very smooth, and which in some instances may otherwise not provide adequate retention of the substrates 104 on the pedestal 150.

In yet another version, a component 20 comprising the contamination-reducing material comprises a support structure 25 comprising a lift pin 160, an embodiment of which is shown in FIG. 3. The lift pin 160 comprises a moveable elongated member 161 having a tip 162 adapted to lift and lower a substrate from a surface of a support 100. The lift pin 160 can be a part of a lift pin assembly 163, including a lift pin support 164 that holds one or more lift pins 160, and that can be attached to a bellows (not shown) to raise and lower the lift pins 160. The lift pin 160 can comprise at least one of the contamination-reducing materials described above, such as at least one of the diamond-like materials and the high-purity ceramics. For example, the lift pin 160 may comprise a coating 24 of the contamination reducing-material that covers at least a portion of the tip 162 of the lift pin 160, to provide a contact surface 22 that reduces contamination of the substrate 104. In one version, a preferred contamination reducing coating for the lift pin 160 comprises a coating 24 comprising a diamond-like material, the coating 24 having a thickness or from about 1 micrometer to about 4 micrometers on the tip 162 of the lift pin 160. In another version, a preferred contamination reducing coating for the lift pin 160 comprises a coating 24 comprising a high-purity ceramic comprising silicon nitride. In yet another version, the preferred contamination reducing coating comprises silicon carbide.

In another version, a component 20 comprising the contamination-reducing material comprises a support shutter 180, an embodiment of which is shown in FIG. 4. The support shutter 180 is adapted to protect a surface 28 of a substrate support 100 when the substrate 104 is not present on the support 100, for example during a chamber cleaning process.

The shutter 180 inhibits the deposition of material onto the surface 28, such as material that can be knocked loose from a sputtering target during cleaning of the target and chamber. The shutter 180 typically comprises a structure 25 comprising a disc 181 that is sized and shaped to cover at least a portion of the surface 28 of the support 100, and may even substantially entirely cover an exposed surface 28 of the support 100. The surface 28 can comprise, for example, the top surfaces 22 of mesas 112 (not shown), and can also comprise the top of a substantially planar support surface 28 (as shown.) A mechanical arm (not shown) can rotate the shutter disk 181 onto the surface 28 of the support to cover the surface 28, and can rotate the shutter disk 181 away from the support surface 28 to process a substrate 104 on the support 100.

To reduce contamination of the support surface 28, and thus the substrate 104, the shutter disc 180 desirably comprises at least one of the contamination-reducing materials described above, such as for example at least one of the diamond-like materials and high-purity ceramic materials. In one version, the shutter disc 181 comprises a bottom surface 183 comprising a coating 24 having the contamination-reducing material. The coating 24 provides a lower surface 184 that reduces contamination of the substrate and support from metal particulates resulting from contact of the surface 184 with the surface 28 of the support 100. The shutter disc 181 can also be mechanically attached to a coating layer 24 of contamination reducing coating, for example with a connecting pin. In another version, the disc 181 comprises a top surface 189 having the metal-contamination reducing material, such as the coating 24 (not shown), and the disc 181 may also comprise a coating 24 that covers substantially the entire disc. The shutter disc 181 can comprise a contamination reducing material comprising, for example, at least one of high purity silicon carbide, silicon nitride, silicon and silicon oxide. In a preferred version, the lower surface 184 of the shutter disc 181 comprises a contamination reducing coating 24 comprising a high-purity silicon nitride material.

Other components 20 that could comprise the contamination-reducing materials described can include the blades of robot transfer arms, rings on a substrate support, and other components involved in the support or transfer of substrates 104 for processing.

The components 20 having the contamination reducing coatings may be a part of a multi-chamber apparatus 102 comprising a plurality of processing chambers 106a-d. An embodiment of an apparatus 102 suitable for processing substrates 10 comprises one or more processing chambers 106a-d, as shown in FIG. 6. The chambers 106a-d are mounted on a platform, such as an Endura 2 platform from Applied Materials, Inc., of Santa Clara, Calif., that provides electrical, plumbing, and other support functions. The platform 110 typically supports a load lock 107 to receive a cassette 115 of substrates 104 to be processed and a substrate transfer chamber 117 containing a robot 119 to transfer substrates from the cassette 115 to the different chambers 106a-d for processing and return them after processing. The different chambers 106a-d may include, for example, a cleaning chamber, an etching chamber, a deposition chamber for depositing materials on substrates, optionally, a heat treatment chamber, and other processing chambers. For example, in one version, one of the chambers 106a-d comprises a heat treatment chamber comprising a heating pedestal 151 to heat the substrate 104 before processing to degas the substrate 104. After degassing of the substrate 104, the substrate 104 can be transferred by the robot 119 to a process chamber 106 to etch material on the substrate 104. The substrate 104 can also be transferred by the robot 119 to a process chamber comprising a deposition chamber, for example to deposit a barrier layer onto a substrate 104 held on an electrostatic chuck. After processing, the substrate 104 can be transferred by the robot 119 to a cool-down chamber where the substrate can be placed on a cooling pedestal 152 to cool the substrate 104. The chambers 106a-d are interconnected to form a continuous vacuum environment within the apparatus 102 in which the process may proceed uninterrupted, thereby reducing contamination of substrates 104 that may otherwise occur when transferring wafers between separate chambers for different process stages. The components in the apparatus 102, such as components that contact or support the substrate 104, also desirably comprise contamination reducing materials to reduce the contamination of the substrate 104.

Figure 7B:
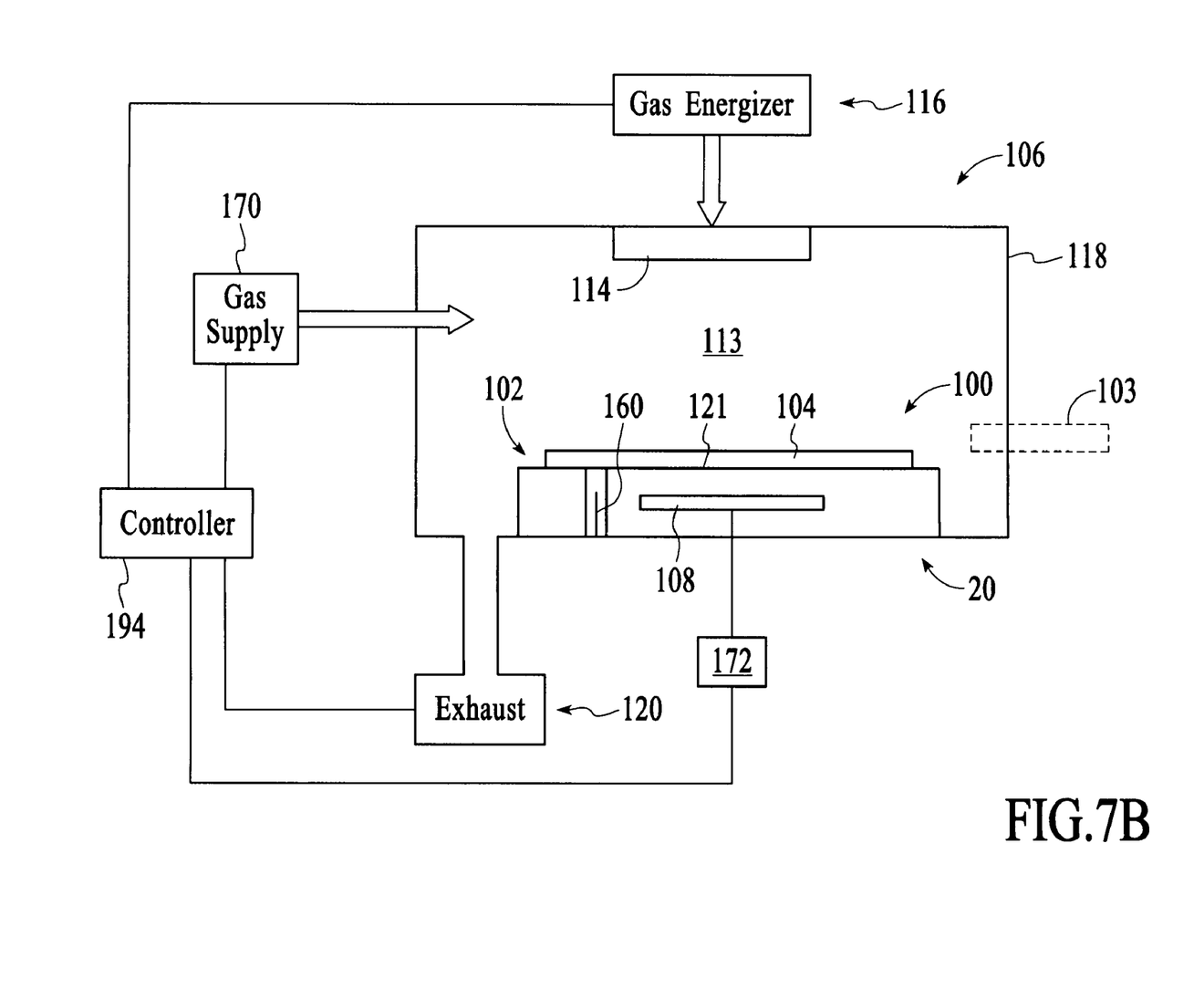
FIG. 7b is a sectional side view of an embodiment of a substrate processing chamber.

An embodiment of a process chamber 106 which may comprise the components 20 having the contamination-reducing material is shown in FIG. 7b. The chamber 106 comprises an enclosure wall 118, which may comprise a ceiling, sidewalls, and a bottom wall that enclose a process zone 113. In operation, process gas is introduced into the chamber 106 through a gas supply 130 that includes a process gas source, and a gas distributor. The gas distributor may comprise one or more conduits having one or more gas flow valves and one or more gas outlets around a periphery of the substrate 104 which may be held in the process zone 113 on the substrate support 100 having a substrate receiving surface 121. Alternatively, the gas distributor may comprise a showerhead gas distributor (not shown). Spent process gas and process byproducts are exhausted from the chamber 106 through an exhaust 120 which may include an exhaust conduit that receives spent process gas from the process zone 113, a throttle valve to control the pressure of process gas in the chamber 106, and one or more exhaust pumps.

The process gas may be energized to process the substrate 104 by a gas energizer 116 that couples energy to the process gas in the process zone 113 of the chamber 106. In one version, the gas energizer 116 comprises process electrodes that may be powered by a power supply to energize the process gas. The process electrodes may include an electrode that is or is in a wall, such as a sidewall or ceiling of the chamber 106 that may be capacitively coupled to another electrode, such as an electrode 108 in the support 100 below the substrate 104. Alternatively or additionally, the gas energizer 116 may comprise an antenna comprising one or more inductor coils which may have a circular symmetry about the center of the chamber. In yet another version, the gas energizer 116 may comprise a microwave source and waveguide to activate the process gas by microwave energy in a remote zone upstream from the chamber 106. In a physical vapor deposition chamber 106 adapted to deposit material on a substrate 104, the chamber further comprises a target 114 facing the substrate 104 that is sputtered by the energized gas to deposit material from the target 114 onto the substrate 104.

To process a substrate 104, the process chamber 106 is evacuated and maintained at a predetermined sub-atmospheric pressure. The substrate 104 is then provided on the support 100 by a substrate transport, such as for example a robot arm 103 and a lift pin 160. The substrate 104 can be held on the support 100 by applying a voltage to the electrode 108 in the support 100, for example via an electrode power supply 172. The gas supply 170 provides a process gas to the chamber 106 and the gas energizer 116 couples RF or microwave energy to the process gas to energizes the gas to process the substrate 104. Effluent generated during the chamber process is exhausted from the chamber 106 by the exhaust 120.

The chamber 106 and multi-chamber apparatus 101 can be controlled by a controller 194 that comprises program code having instruction sets to operate components of each chamber 106a-d to process substrates 104 in the chamber 106, as shown for example in FIG. 7b. For example, the controller 194 can comprise a substrate positioning instruction set to operate one or more of the substrate support 100 and robot arm 119 and lift pins 160 to position a substrate 104 in the chamber 106; a gas flow control instruction set to operate the gas supply 170 and flow control valves to set a flow of gas to the chamber 106; a gas pressure control instruction set to operate the exhaust 120 and throttle valve to maintain a pressure in the chamber 106; a gas energizer control instruction set to operate the gas energizer 116 to set a gas energizing power level; a temperature control instruction set to control temperatures in the chamber 106; and a process monitoring instruction set to monitor the process in the chamber 106.

Although exemplary embodiments of the present invention are shown and described, those of ordinary skill in the art may devise other embodiments which incorporate the present invention, and which are also within the scope of the present invention. For example, the support 100, heat exchange pedestal 150, lift pins 160, or other components 20 may comprise other shapes and configurations other than those specifically described. Also, the contamination-reducing materials may be fabricated by means other than those specifically described and may comprise different configurations on the components 20. Furthermore, relative or positional terms shown with respect to the exemplary embodiments are interchangeable. Therefore, the appended claims should not be limited to the descriptions of the preferred versions, materials, or spatial arrangements described herein to illustrate the invention.

What is claimed is:

1. A substrate support comprising:
   (a) a ceramic structure having an electrode embedded therein, the electrode being chargeable to electrostatically hold a substrate; and
   (b) a contact surface comprising a plurality of mesas, the mesas comprising a coating of a diamond-like carbon material directly over a titanium metal adhesion layer, the diamond-like carbon material comprising a composition of from about 50 atom % to about 90 atom % carbon, from about 5 atom % to about 10 atom % hydrogen, from about 10 atom % to about 20 atom % silicon, and from about 5 atom % to about 10 atom % oxygen, to provide a coefficient of friction of less than about 0.3, an average surface roughness of less than about 0.4 micrometers, and a microhardness of at least about 8 GPa, whereby the diamond-like coating reduces the abrasion and contamination of substrates that contact the coating.

2. A support according to claim 1 wherein the diamond-like carbon material comprises a resistivity of from about $10^4$ Ohm·cm to about $10^8$ Ohm·cm.

3. A support according to claim 1 wherein the diamond-like carbon material comprises from about 0.1 atom % to about 10 atom % of a metal additive, whereby the metal additive changes the resistivity of the coating.

4. A support according to claim 1 wherein the coating comprises a thickness of from about 1 to about 20 microns.

5. A support according to claim 1 wherein the titanium metal adhesion layer comprises a thickness of from about 0.25 to about 4 microns.

6. A support according to claim 1 wherein the diamond-like carbon material comprises a diamond-like nanocomposite having networks of (i) carbon and hydrogen, and (ii) silicon and oxygen.

7. A support according to claim 1 wherein the diamond-like carbon material comprises a metal additive.

8. A support according to claim 1 wherein the ceramic structure comprises AlN or $Al_2O_3$.

9. A support according to claim 1 wherein the diamond-like carbon material is co-deposited with a metal additive by a process combining physical vapor deposition of the metal additive in a plasma enhanced chemical vapor deposition environment.

10. A substrate support comprising:
    (a) a ceramic support structure having an electrode embedded therein, the electrode being chargeable to electrostatically hold a substrate; and
    (b) a contact surface comprising a plurality of mesas, each mesa substantially entirely composed of (i) a surface coating comprising a diamond-like carbon material having a composition of from about 50 atom % to about 90 atom % carbon, from about 5 atom % to about 10 atom% hydrogen, from about 10 atom % to about 20 atom % silicon, and from about 5 atom % to about 10 atom % oxygen, the surface coating comprising a coefficient of friction of less than about 0.3, an average surface roughness of less than about 0.4 micrometers, and a microhardness of at least about 8 GPa; and (ii) an adhesion layer comprising a metal layer between the ceramic support structure and the surface coating.

11. A support according to claim 10 wherein the diamond-like carbon material comprises a diamond-like nanocomposite having networks of (i) carbon and hydrogen, and (ii) silicon and oxygen.

12. A support according to claim 10 wherein the diamond-like carbon material comprises a resistivity of from about $10^4$ Ohm·cm to about $10^8$ Ohm·cm.

13. A support according to claim 12 wherein the diamond-like carbon material comprises from about 0.1 atom % to about 10 atom % of a metal additive, whereby the metal additive changes the resistivity of the coating.

14. A substrate support comprising:
    (a) a ceramic support structure having an electrode embedded therein, the electrode being chargeable to electrostatically hold a substrate; and
    (b) a contact surface comprising a plurality of mesas, each mesa comprising:
        (i) a titanium layer; and
        (ii) a diamond-like carbon coating layer over the titanium layer, the diamond-like carbon coating layer comprising (i) a composition of from about 50 atom % to about 90 atom % carbon, from about 5 atom % to about 10 atom % hydrogen, from about 10 atom % to about 20 atom % silicon, and from about 5 atom % to about 10 atom % oxygen, (ii) a coefficient of friction of less than about 0.3, (iii) an average surface roughness of less than about 0.4 micrometers, and (iv) a microhardness of at least about 8 GPa.

15. A support according to claim 14 wherein the diamond-like carbon coating layer comprises a resistivity of from about $10^4$ Ohm·cm to about $10^8$ Ohm·cm.

16. A support according to claim 14 wherein the diamond-like carbon coating layer comprises a thickness of from about 1 to about 20 microns.

17. A support according to claim 14 wherein the diamond-like carbon coating layer comprises a metal additive in a concentration of from about 0.1 atom % to about 10 atom %, whereby the metal additive changes the resistivity of the coating.

18. A support according to claim 14 wherein the titanium layer comprises a thickness of from about 0.25 to about 4 microns.

19. A support according to claim 14 wherein the ceramic support structure comprises AlN or $Al_2O_3$.

20. A support according to claim 14 wherein the diamond-like carbon coating layer comprises a hardness of from about 18 GPa to about 25 GPa.

* * * * *